United States Patent
Rumennik et al.

(10) Patent No.: US 6,639,277 B2
(45) Date of Patent: Oct. 28, 2003

(54) HIGH-VOLTAGE TRANSISTOR WITH MULTI-LAYER CONDUCTION REGION

(75) Inventors: Valdimir Rumennik, Los Altos Hills, CA (US); Donald R. Disney, Cupertino, CA (US); Janardhanan S. Ajit, Sunnyvale, CA (US)

(73) Assignee: Power Integrations, Inc., San Jose, CA (US)

( * ) Notice: Subject to any disclaimer, the term of this patent is extended or adjusted under 35 U.S.C. 154(b) by 0 days.

(21) Appl. No.: 09/961,235

(22) Filed: Sep. 20, 2001

(65) Prior Publication Data

US 2002/0050613 A1 May 2, 2002

Related U.S. Application Data

(60) Division of application No. 09/574,563, filed on May 17, 2000, now Pat. No. 6,570,219, which is a division of application No. 09/245,030, filed on Feb. 5, 1999, now Pat. No. 6,207,994, which is a continuation-in-part of application No. 08/744,182, filed on Nov. 5, 1996, now abandoned.

(51) Int. Cl.[7] .......................... H01L 29/76; H01L 23/58
(52) U.S. Cl. ................. 257/342; 257/339; 257/343; 257/492
(58) Field of Search .................. 257/262, 328, 257/314, 339–344, 492–495, 488

(56) References Cited

U.S. PATENT DOCUMENTS

| 4,618,541 A | 10/1986 | Forouhi et al. |
|---|---|---|
| 4,626,879 A | 12/1986 | Colak |
| 4,665,426 A | 5/1987 | Allen et al. |
| 4,754,310 A | 6/1988 | Coe |
| 4,764,800 A | 8/1988 | Sander |
| 4,811,075 A | 3/1989 | Elkund |
| 4,890,146 A | 12/1989 | Williams et al. |
| 4,922,327 A | 5/1990 | Mena et al. |
| 5,010,024 A | 4/1991 | Allen et al. |
| 5,021,858 A | 6/1991 | Hall |
| 5,025,296 A | 6/1991 | Fullerton et al. |
| 5,146,298 A | 9/1992 | Eklund |
| 5,155,574 A | 10/1992 | Yamaguchi |
| 5,237,193 A | 8/1993 | Williams et al. |
| 5,258,636 A | 11/1993 | Rumennik et al. |

(List continued on next page.)

FOREIGN PATENT DOCUMENTS

| DE | 43 09 764 | 9/1994 |
|---|---|---|
| EP | 0 295 391 A1 | 4/1988 |
| JP | 56-38867 | 4/1981 |
| JP | 57-12557 | 1/1982 |
| JP | 57-12558 | 1/1982 |
| JP | 04107877 A | 4/1992 |
| JP | 5-21791 | 1/1993 |
| JP | 6-224426 | 12/1994 |

OTHER PUBLICATIONS

Appels and Vaes, "High Voltage Thin Layer Devices (RESURF Devices)," *IEDM Tech. Digest*, pp. 238–241, 1979.

(List continued on next page.)

*Primary Examiner*—Ori Nadav
(74) *Attorney, Agent, or Firm*—Burgess & Bereznak, LLP

(57) ABSTRACT

A high voltage insulated gate field-effect transistor includes an insulated gate field-effect device structure having a source and a drain, the drain being formed with an extended well region having one or more buried layers of opposite conduction type sandwiched therein. The one or more buried layers create an associated plurality of parallel JFET conduction channels in the extended portion of the well region. The parallel JFET conduction channels provide the HVFET with a low on-state resistance.

19 Claims, 15 Drawing Sheets

U.S. PATENT DOCUMENTS

| | | | |
|---|---|---|---|
| 5,270,264 A | | 12/1993 | Andideh et al. |
| 5,294,824 A | * | 3/1994 | Okada .......................... 257/409 |
| 5,313,082 A | | 5/1994 | Eklund |
| 5,324,683 A | | 6/1994 | Fitch et al. |
| 5,349,225 A | * | 9/1994 | Redwine et al. ............ 257/336 |
| 5,359,221 A | | 10/1994 | Miyamoto et al. |
| 5,386,136 A | | 1/1995 | Williams et al. |
| 5,438,215 A | | 8/1995 | Tihanyi |
| 5,521,105 A | | 5/1996 | Hsu et al. |
| 5,550,405 A | | 8/1996 | Cheung et al. |
| 5,646,431 A | * | 7/1997 | Hsu et al. ................... 257/342 |
| 5,654,206 A | | 8/1997 | Merrill |
| 5,656,543 A | | 8/1997 | Chung |
| 5,659,201 A | | 8/1997 | Wollesen |
| 5,943,595 A | | 8/1999 | Akiyama et al. |
| 6,010,926 A | * | 1/2000 | Rho et al. .................... 438/199 |
| 6,184,555 B1 | * | 2/2001 | Tihanyi et al. .............. 257/342 |
| 6,534,829 B2 | | 3/2003 | Sogo et al. |

OTHER PUBLICATIONS

Fujihira ("*Theory of Semiconductor Superjunction Devices*," *Jpn. J. Appl. Phy.*, vol. 36, pp. 6254–6262, Oct. 1997).

Patent Abstract of Japan, vol. 018, No. 590 (E–1628), Nov. 10, 1994 and JP 06224426 (Matsushita Electron Corp.) Aug. 12, 1994.

Patent Abstract of Japan, vol. 016, No. 347 (E–1240), Jul. 27, 1992 and JP 04 107867 (Matsushita Electron Corp.) Apr. 9, 1992.

*Air–Gap Formation During IMD Deposition to Lower Interconnect Capacitance*, B. Shieh, K.C. Saraswat, IEEE Electron Device Letters, vol., 19, No. 1, Jan. 1998.

*Modeling and Optimization of Lateral High Voltage IC Devices To Minimize 3–D Effects*, Hamza Yilmaz, R&D Engineering, Semiconductor Business Division, General Electric Company, NC., pp. 290–294.

* cited by examiner

HIGH-VOLTAGE TRANSISTOR WITH MULTI-LAYER CONDUCTION REGION

RELATED APPLICATIONS

The present application is a divisional application of Ser. No. 09/574,563, filed May 17, 2000 now U.S. Pat. No. 6,570,219, which is a divisional application of Ser. No. 09/245,030, filed Feb. 5, 1999, now U.S. Pat. No. 6,207,994, which is a continuation-in-part application of Ser. No. 08/744,182, filed Nov. 5, 1996, now abandoned. This application is also related to Ser. No. 09/245,029, filed Feb. 5, 1999, now U.S. Pat. No. 6,168,983, and entitled, "Method of Making A High-Voltage Transistor With Multiple Lateral Conduction Layers". The related applications are assigned to the assignee of the present application.

FIELD OF THE INVENTION

The present invention relates to high voltage field-effect transistors. More specifically, the present invention relates to high voltage field-effect transistor structures that include an insulated gate field-effect transistor in series with a junction field-effect transistor.

BACKGROUND OF THE INVENTION

It is conventional to construct a high-voltage, insulated-gate, field-effect transistor (HVFET) having a high breakdown voltage and a low "on-state" resistance. To accomplish this end, practitioners in the art have used an insulated gate field-effect transistor (IGFET) placed in series with a high-voltage junction field-effect transistor (JFET). Such a transistor is capable of switching at high voltages, has low values of on-state resistance, and has insulated-gate control. Moreover, the HVFET may advantageously be fabricated near low voltage logic transistors on a single integrated circuit chip to form what is commonly referred to as a power integrated circuit (PIC).

One goal in the art is to produce a transistor with a high breakdown voltage ($V_{bd}$) using as small a surface area as possible. The HVFET must provide a $V_{bd}$ that is above the minimum allowed for a given application. Realizing high $V_{bd}$ in a small area reduces the cost of the PIC. Traditional HVFET devices with a high breakdown voltage require large amounts of silicon area and are expensive to fabricate.

It is also desirable to fabricate HVFETs that occupy as small a surface area as possible to realize a given on-state resistance. The figure of merit often used is known as specific on-resistance ($R_{sp}$), which is the product of on-state resistance and surface area. A lower $R_{sp}$ allows a smaller HVFET transistor to be used to meet the on-state resistance requirements of a given application, which reduces the area and, respectively, the cost of the PIC.

Another goal in the art is to provide a highly manufacturable HVFET design that consistently delivers the required combination of $V_{bd}$ and $R_{sp}$ over a range of normal process variances. To realize this goal, the manufacturing process should introduce minimal variance in the critical device parameters, and the HVFET should exhibit minimal sensitivity to process variations.

To try to achieve the aforementioned goals, researchers and engineers have experimented with a variety of different device structures. For example, a lateral HVFET, is disclosed in "High Voltage Thin Layer Devices (RESURF Devices)," by Appels and Vaes, IEDM Tech. Digest, pp. 238–241, (1979). This device is fabricated in accordance with the Reduced Surface Field (RESURF) principal, in which an extended drain region is used to support the high off-state voltage. The RESURF principal, however, mandates that the charge in the extended drain region, which serves as the channel of a lateral junction field-effect transistor (JFET), be carefully controlled to obtain high $V_{bd}$. To keep the maximum electric field below the critical field at which avalanche breakdown occurs, the amount of charge in the JFET channel is typically limited to a maximum of about $1 \times 10^{12}$ cm$^{-2}$. When the HVFET is in the "on" state, the resistance of the JFET channel constitutes a large portion of the on-state resistance of the HVFET. Therefore, the limitation on the maximum charge in the JFET channel also sets the minimum specific on-resistance of the device.

A HVFET having an extended drain region with a top layer of a conductivity type opposite that of the extended drain region is disclosed in U.S. Pat. No. 4,811,075. The '075 patent teaches that this structure approximately doubles the charge in the JFET channel of an HVFET, thereby lowering the $R_{sp}$ by about 50%. Because this top layer helps to deplete the extended drain when the extended drain is supporting a high voltage, a high breakdown voltage is maintained despite the increased charge density.

A HVFET in which two JFET channels are arranged in parallel to increase charge and reduce $R_{sp}$ is described in U.S. Pat. No. 5,313,082. This structure has several drawbacks. First, proper charge balance among the layers must be maintained in accordance with the RESURF principal discussed above. Secondly, according to the '082 patent the N-well region, the P-type buried region, and the upper N-type region are all diffused from the surface. This makes it very difficult to maintain adequate charge balance among the layers. In addition, the heavily doped p-n junction between the buried layer and drain diffusion region degrades the $V_{bd}$ of the device.

Thus, there still exists a need for an improved HVFET and a method of fabricating the same. The HVFET should exhibit a low specific on-state resistance, be easily integrated on the same chip along with low voltage logic devices, achieve the required minimum breakdown voltage in the smallest possible surface area, and be relatively inexpensive to manufacture.

SUMMARY OF THE INVENTION

In one embodiment, the HVFET of the present invention comprises a substrate of a first conductivity type. A first region of a second conductivity type is disposed in the substrate. The first region having a laterally extended portion that forms a lateral boundary with the substrate. A drain diffusion region of the second conductivity type is disposed in the first region and is separated from the lateral boundary by the laterally extended portion. A second region of the first conductivity type is also disposed in the substrate and spaced-apart from the lateral boundary.

The HVFET also includes a source diffusion region of the second conductivity type disposed in the second region. A channel region is formed between the source diffusion region and the lateral boundary. An insulated gate is disposed above the channel region to control current flow therein. A buried region of the first conductivity type is sandwiched within the laterally extended portion of the first region to form a junction field-effect structure in which current flows in the first region both above and below the buried region.

BRIEF DESCRIPTION OF THE DRAWINGS

The present invention is illustrated by way of example, and not limitation, in the figures of the accompanying drawings, wherein.

DETAILED DESCRIPTION

In the following description, numerous specific details are set forth, such as material types, doping levels, structures, processing steps, etc., in order to provide a thorough understanding of the present invention. Practitioners having ordinary skill in the semiconductor arts will understand that the invention may be practiced without many of these details. In other instances, well-known elements, techniques, and processing steps have not been described in detail to avoid obscuring the invention.

The present invention relates to a high-voltage field-effect transistor that provides a low on-state resistance for a given breakdown voltage. While n-channel HVFETs are presented herein for illustrative purposes, a p-channel HVFET can be fabricated by appropriate reversal of the conductivity types associated with the various regions and layers.

Device Structure

Figure 1:
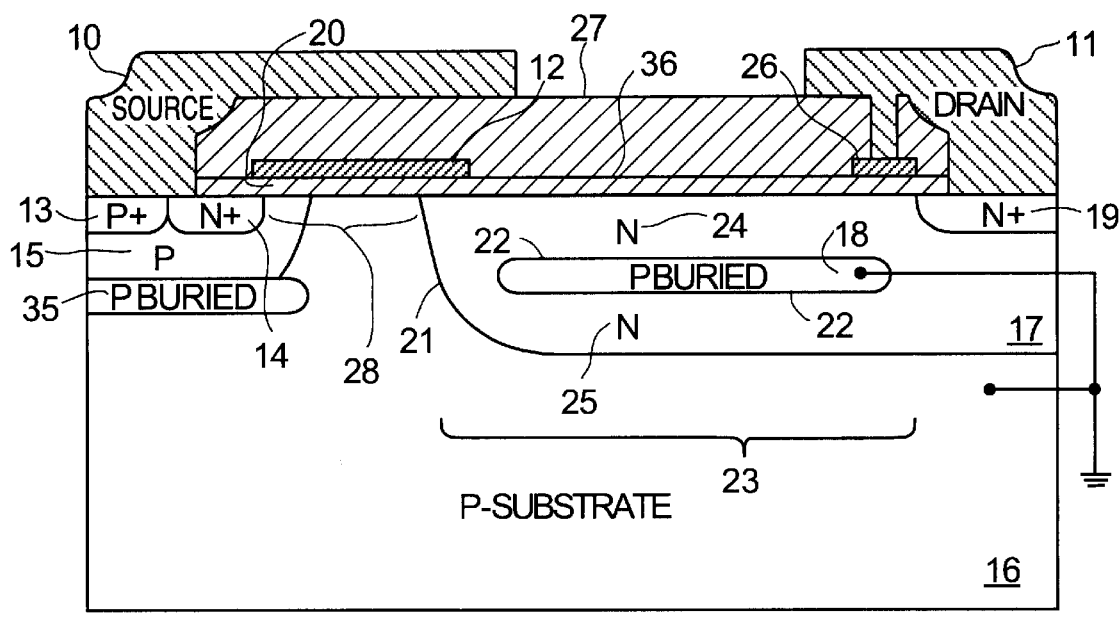
FIG. 1 is a cross-sectional side view of one embodiment of the high-voltage, field-effect transistor (HVFET) of the present invention.

Referring now to FIG. 1, an exemplary n-channel HVFET is shown in accordance with one embodiment of the present invention. It should be understood that the present invention equally contemplates an analogous p-channel HVFET. The p-channel transistor may be realized by utilizing the opposite conductivity types for all of the illustrated diffusion regions.

FIG. 1 illustrates an insulated-gate field-effect transistor (IGFET) having a gate 12 (comprised, for example, of polysilicon), an insulating layer 20, comprised of silicon dioxide or another appropriate dielectric insulating material, and an underlying lightly-doped p-type substrate region 16. Gate 12, insulating layer 20 and substrate 16 together form the insulated gate region of the device. In one embodiment, the gate region is a metal-oxide semiconductor (MOS), and the IGFET is a MOS transistor.

An optional p-type region 15 is disposed in substrate 16 spaced-apart from N-well region 17. Additionally, a p-type buried layer 35 may be included beneath P-well 15. A N+ source diffusion region 14 is shown formed in region 15. An IGFET channel region 28 is formed between N+ source diffusion region 14 and N-well region 17. A source electrode 10 provides an electrical connection to N+ source diffusion region 14. Similarly, a drain electrode 11 connects to N+ drain diffusion region 19. Source and drain electrodes 10 and 11 may comprise a number of widely used metals or metal alloys. Source electrode 10 is shown extending over an isolative layer 27 formed over gate 12 where it functions as a field plate.

In the illustrative embodiment, a P+ diffusion region 13 is disposed adjacent to N+ source diffusion region 14. Diffusion region 13 increases the integrity of the source-to-substrate connection and reduces susceptibility of the device to parasitic bipolar effects.

The HVFET of FIG. 1 also includes an N-well region 17 having a laterally extended drain portion 23 with a lateral boundary 21 formed within substrate 16. Disposed within N-well region 17 is a p-type buried region 18, and drain diffusion region 19. Buried region 18 is sandwiched within N-well region 17 in the laterally extended drain portion 23. As can be seen, buried region 18 is surrounded above, below and laterally by N-well region 17. The embodiment of FIG. 1 also shows buried region 18 separated from N+ drain diffusion region 19 by a portion of the N-well region 17 to improve the breakdown voltage of the transistor.

A drain electrode 11 provides an electrical connection to N+drain diffusion region 19. Note that drain electrode 11 also connects to a field plate member 26, which is insulated from the substrate and is located adjacent to drain diffusion region 19 over N-well region 17. Like the extended portion of source electrode 10, field plate member 26 acts to reduce peaks in the localized electric field, thereby increasing the breakdown voltage of the transistor.

When the HVFET is in the on-state, electron current flows from the source diffusion region 14 through the IGFET channel region 28, and then through dual, parallel JFET channels, formed by the N-above region 24 and the N-below region 25, and finally to drain diffusion region 19. As described below, the combined charge in the N-above and N-below regions 24 & 25 may be about $3\times10^{12}$ $cm^{-2}$, which is about three times higher than that of a conventional, single JFET channel device. Thus, the resistance of the extended drain region is reduced to about ⅓ that of a conventional device.

As will be described below, other embodiments of the invention comprise additional JFET channels in the N-well region 17 formed by a plurality of p-type buried layers. Thus, the following discussion of features to the invention in which only a single P-buried region lies within the N-well region applies equally to embodiments possessing a plurality of P-buried regions in the N-well region.

In the off-state, N-above region 24, buried region 18, N-below region 25, and a portion of the substrate 16 are mutually depleted of free carriers. In order to keep the electric field below the critical electric field at which avalanche breakdown occurs, the charge in each layer is balanced. For example, the charge concentration is approximately $1 \times 10^{12}$ cm$^{-2}$ in N-above region 24, about $2 \times 10^{12}$ cm$^{-2}$ in buried region 18, and about $2 \times 10^{12}$ cm$^{-2}$ in N-below region 25.

In one implementation, buried region 18 is not left floating (electrically), but instead is connected to substrate 16 or another region having substantially the same potential. Substrate 16 is typically connected to ground, which provides the double-sided JFET with enhanced switching characteristics.

As discussed above, the HVFET of FIG. 1 may include an additional region 15 into which the N+ source diffusion region 14 and the P+ diffusion region 13 are diffused. One function of region 15 is to reduce the susceptibility of the HVFET to drain-to-source punch-through. Another function is to provide an appropriate threshold voltage for the IGFET with less variance. Region 15 also lowers the base resistance of the parasitic NPN device and, thereby increases the safe operating area of the HVFET.

The embodiment of FIG. 1 may also include a p-type buried layer 35 underlying the N+ source diffusion region 14 and the P+ diffusion region 13. Note that this region can be formed with the same implant step as p-type buried region 18, so as to minimize the cost and complexity of the process. Buried layer 35 offers the same advantages as those described above for P-region 15. However, buried layer 35 can be more heavily doped than region 15 because it is removed from the IGFET channel region and, therefore, does not affect the threshold voltage of the IGFET. Being more heavily doped, this layer is also effective in preventing parasitic NPN action.

Figure 2:
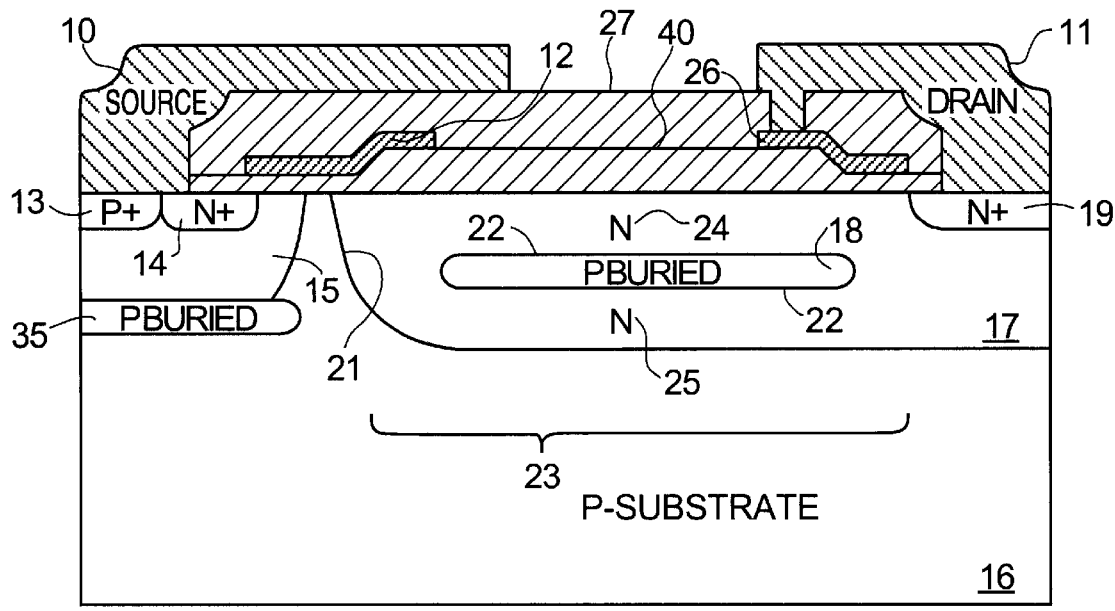
FIG. 2 is a cross-sectional side view of another embodiment of the present invention.

Another embodiment of the invention is shown in FIG. 2. This embodiment differs from that of FIG. 1 only in the thickness of the oxide above the laterally extended portion 23 of N-well region 17. In FIG. 1, a uniform, thin film of oxide 36 is employed. The IGFET gate oxide may be used, which has a typical thickness of 200–1000 angstroms. One advantage of using such thin oxide is that it reduces the required energy for the p-type buried implant used to form region 18.

In contrast, the device of FIG. 2 shows a thicker oxide layer 40 (typically 5000–15000 angstroms) above most of the laterally extended drift portion 23 of N-well region 17. One benefit of thick oxide layer 40 is that it provides an additional level when designing the source and drain field plates that extend from the source and drain electrodes. Thick oxide layer 40 may also provide higher yield and reliability. It should be understood, however, that the inclusion of the overlying oxide layer, or the thickness thereof, is not an essential aspect of the present invention. In certain embodiments, it may be eliminated entirely, or substituted with other suitable materials such as silicon nitride, etc.

Figure 3:
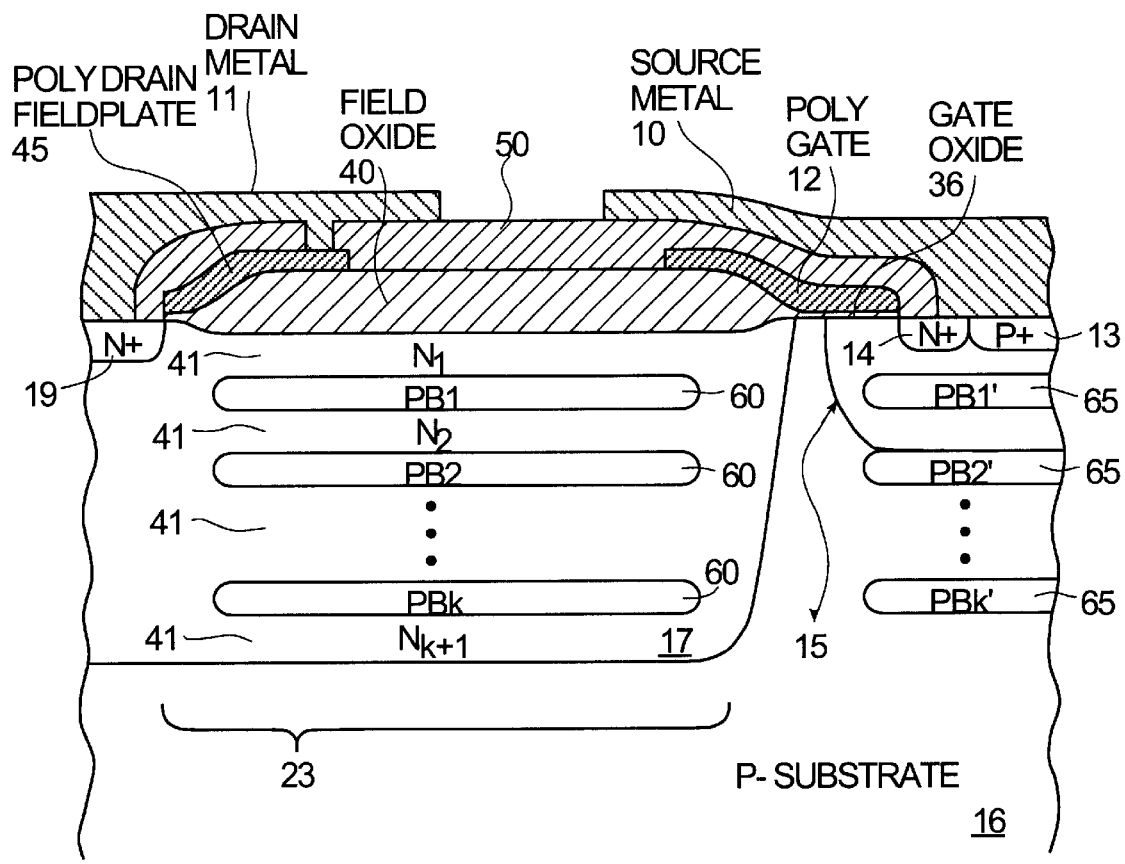
FIG. 3 is a cross-sectional side view of still another embodiment of the present invention, which includes a plurality of buried layers.

FIG. 3 shows another embodiment of the invention in which a plurality of JFET conduction channels 41 are formed in the N-well region 17. Other aspects and features of this embodiment are similar to the embodiment with dual JFET channels illustrated in FIGS. 1 and 2. For example, drain electrode 11 connects to a drain diffusion region 19 and includes a field plate member 45 that covers part of laterally extended portion 23. Similarly, source electrode 11 is electrically connected to N+ source diffusion region 14 and P+ diffusion region 13. Source electrode also includes a metal field plate member that extends over the channel region of the IGFET. Surrounding N+ source diffusion region 14 and P+ diffusion region 13, a p-type region 15 is optionally included to prevent punch-though. Gate 12 controls current flow in the IGFET channel region formed between N+ source diffusion region 14 and N-well region 17.

A thick oxide layer 40 may optionally overlie laterally extended portion 23 of N-well region 17. The drain field plate 45, which may be constructed from polysilicon or other suitable materials, is separated from an overlying portion of drain metal 11 by the inter-level dielectric layer 50.

With continuing reference to FIG. 3, two or more p-type buried regions 60 are disposed within N-well region 17. Regions 60 may be formed, for example, by high-energy ion implantation. This results in an N-well region 17 that is divided into multiple JFET conduction channels (e.g., $N_1$–$N_{k+1}$) interleaved with the P-buried regions 60. The implant energies and doses may be chosen such that the maximum charge in the uppermost conduction channel (NJ) is limited to about $1 \times 10^{12}$/cm$^2$, in order to keep the maximum electric field at the $N_1$/$PB_1$ junction below the critical electric field at which avalanche breakdown occurs. The maximum charge in each P-buried regions ($PB_1$–$PB_k$) and each of the remaining JFET channels ($N_2$–$N_{k+1}$) is limited to about $2 \times 10^{12}$/cm$^2$ in the embodiment of FIG. 3.

Those of ordinary skill in the art will appreciate that to construct a N-well region 17 with a plurality of JFET conduction channels, the doping and implant energy levels of the N-well and the plurality of P-buried regions may be chosen to approximate the above-described charge levels. Although the uppermost buried region 60 (labeled "PB1") is illustrated as lying below the upper surface of the N-well region 17, this particular region may also be disposed at the upper surface of the N-well region 17.

Figure 4:
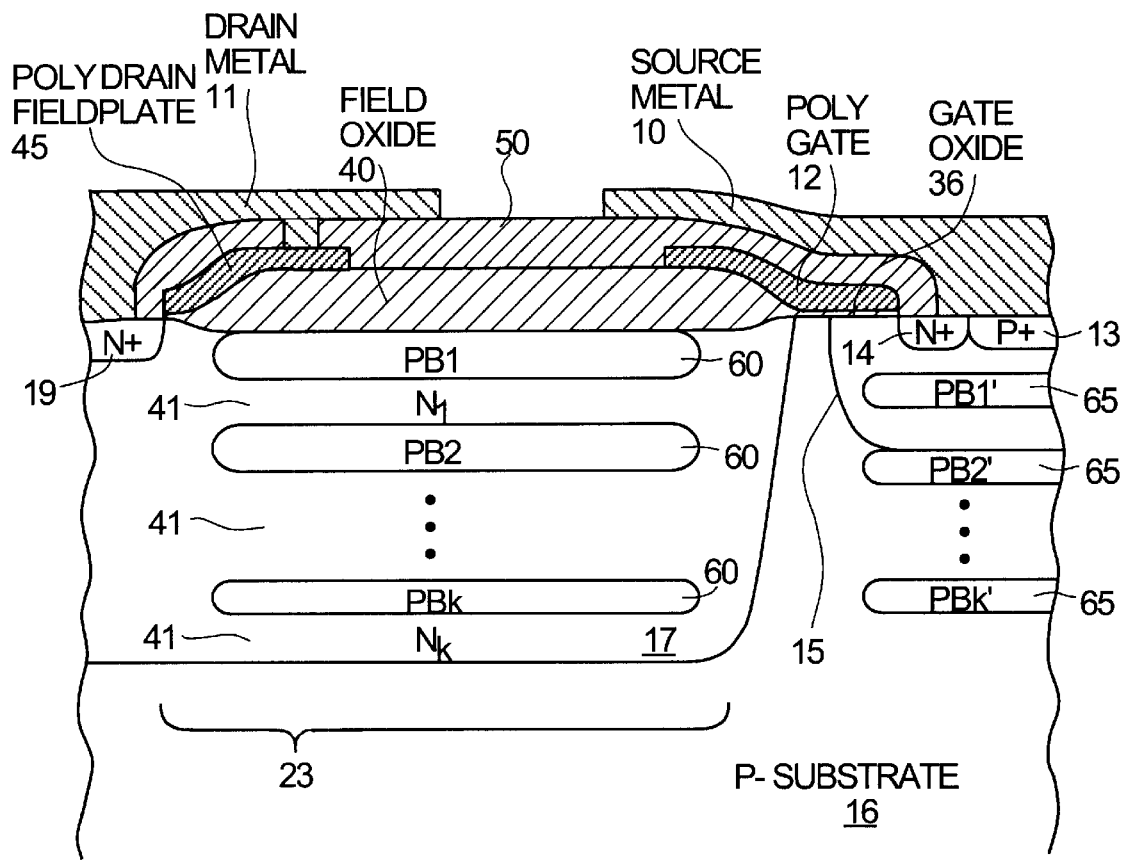
FIG. 4 is a cross-sectional side view of an alternative embodiment of the present invention, which also includes a plurality of buried layers.

With attention directed to FIG. 4, an embodiment of the invention is illustrated in which p-type region 60 denoted PB1 is formed coincident with, and just below, the upper surface of the N-well region 17. In the embodiment of FIG. 4 the number of JFET channels is equal to the number of P-buried regions 60. The charge in the uppermost P-buried layer PB1 is constrained to about $1 \times 10^{12}$/cm$^2$, while the charge in each of the remaining P-buried regions and the charge in each of the JFET channels 41 is constrained to about $2 \times 10^{12}$/cm$^2$.

Because the resistance of the JFET channels 41 is inversely proportional to the total charge in these channels, each additional P-buried region 60 results in a reduction in on-resistance of the HVFET. For example, FIG. 4 shows a plurality of k buried regions 60 implanted into N-well region 17. As a result, there exist k JFET conduction channels 41 formed in N-well region 17. Thus, the embodiments illustrated in FIGS. 3 and 4 may achieve a much lower on-resistance at the same breakdown voltage achieved by prior art devices.

FIGS. 3 and 4 also show the optional inclusion of additional p-type buried regions 65 formed vertically spaced-apart from one another beneath the source diffusion regions 13 and 14. To avoid affecting the splitting of the current in the various JFET conduction channels, the additional buried regions 65 are spaced laterally from buried regions 60 formed in the extended portion 23 of N-well 17. The additional regions 65 counteract the penetration of drain potential into the IGFET channel region. This means that the source diffusion regions 13 and 14 may be fabricated closer to the N-well region 17, advantageously resulting in a HVFET with a reduced IGFET channel length.

Figure 5:
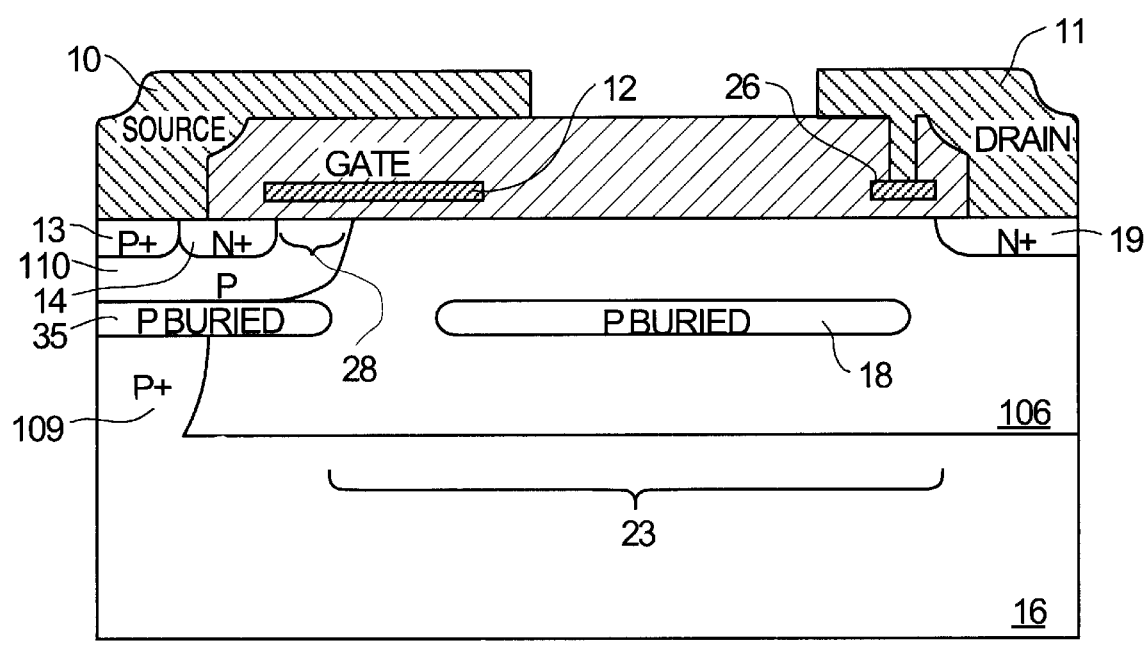
FIG. 5 is a cross-sectional side view of still another embodiment of the present invention.

Another embodiment of the invention is illustrated in FIG. 5. Similar to the previous embodiments, this structure comprises an HVFET having a drain electrode 11 connected to a field plate 26, a drain diffusion region 19, a source 10 electrode 10 (also having an extended field plate), source diffusion regions 13 and 14, substrate 16, and a p-type buried region 18. The embodiment shown in FIG. 5 differs from the previous embodiments in that it does not include an N-well region 17. Rather, the structure of FIG. 5 comprises a n-type layer 106, which may be formed by epitaxial deposition onto substrate 16. Alternatively, ion implantation and diffusion may be utilized to form layer 106 in substrate 16. Layer 106, like previous embodiments, includes a laterally extended portion 23 into which is sandwiched a buried layer 18.

A p-type diffusion region 110 is formed within the n-type layer 106 and is disposed under source diffusion regions 13 and 14. Region 110 provides an IGFET channel region 28 disposed under gate 12 between source diffusion region 14 and n-type layer 106. Region 110 also provides protection from the occurrence of drain-to-source punch-through. The P-buried region 18 disposed within n-type layer 106 acts as an effective gate for a parallel-configured JFET having dual current channels.

In the case where layer 106 is formed by epitaxial deposition, the HVFET structure may be formed by a single high-energy implant to form region 18. A P+ isolation region 109 may be needed where layer 106 is formed by epitaxial deposition. On the other hand, in the case where n-type layer 106 is formed by implantation, P+ isolation region 109 may not be required. An additional p-type buried layer 35 may be implanted underneath the source diffusion regions 13 and 14 to prevent punch-through. This permits realization of an IGFET with reduced channel length; it also reduces the susceptibility of the device structure to parasitic NPN action.

Figure 6:
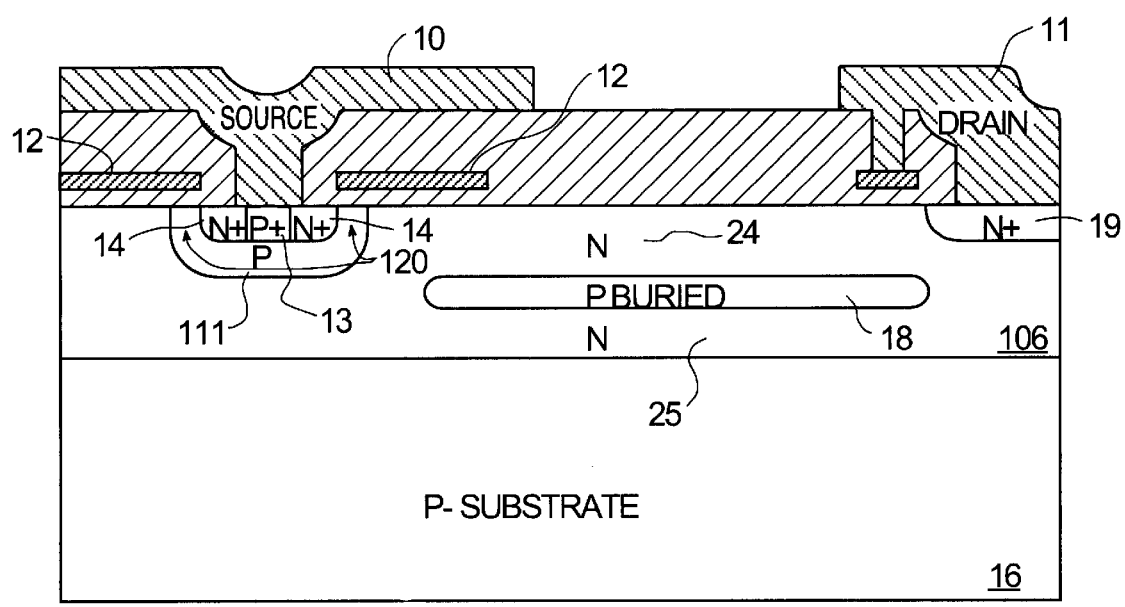
FIG. 6 is a cross-sectional side view of still another embodiment of the present invention.

FIG. 6 depicts a cross-sectional view of another embodiment of the present invention which includes n-type layer 106, which may be formed by epitaxial deposition onto, or implantation and diffusion into, p-type substrate 16. A p-type diffusion region 111 formed within n-type layer 106 serves as the IGFET channel region 120 and provides protection from the occurrence of drain-to-source punch-through. In this embodiment the IGFET channel region 120 is formed in a circular, rectilinear or hemispherical shape between regions 14 and 106. Dual JFET channels are provided for current flow through the N-above region 24 and the N-below region 25.

The presence of the additional IGFET channel region in the embodiment of FIG. 6 provides about twice the IGFET channel width for a given HVFET width compared to previous embodiments. It also has advantages of lower IGFET channel resistance and higher IGFET saturation current compared to other embodiments. While only a single p-type buried layer 18 is illustrated, additional p-type buried layers may be included as discussed previously.

Figure 14:
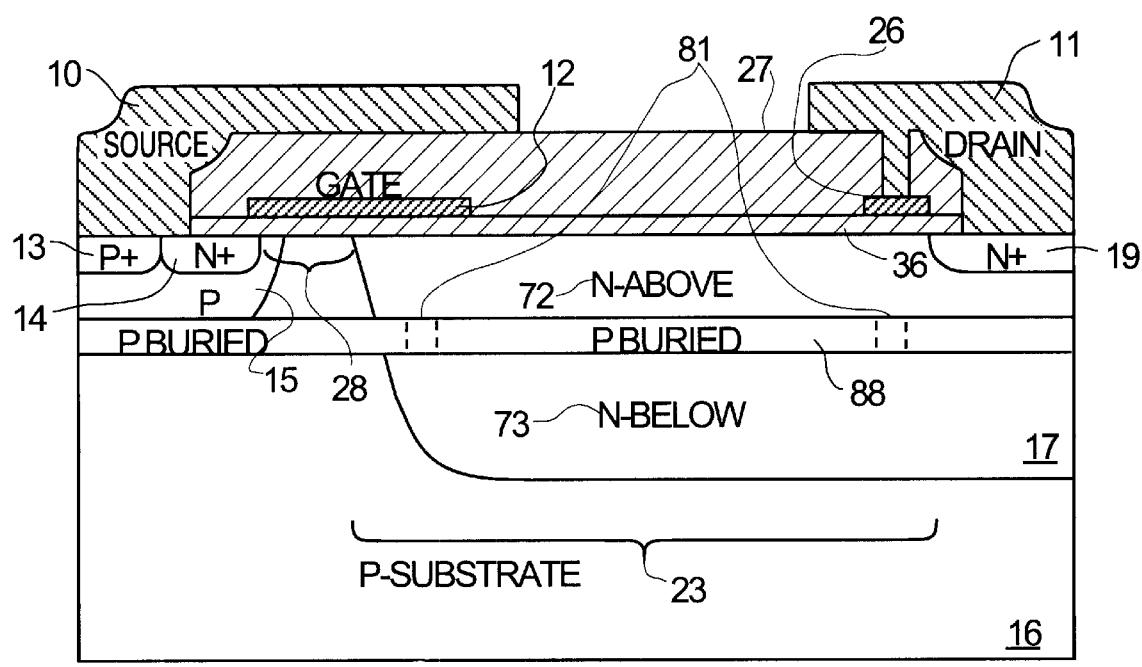
FIG. 14 is a cross-sectional side view of yet another embodiment of the present invention.

In an alternative embodiment of the present invention, the buried region may be formed with a plurality of openings that vertically connect the above conduction region to the below region, thereby permitting current to flow between the above and below region through the openings. FIG. 14 is a cross-sectional side view of this embodiment, which shows a p-type buried layer 88 extending through N-well region 17 and under diffusion regions 13 and 14 of the device. Buried layer 88 includes openings 81 that connect the N-above region 72 to the N-below region 73 to form dual JFET conduction channels. Note that one of the openings is located adjacent to gate 12. Practitioners in the art will appreciate that the embodiment of FIG. 14 advantageously permits the design of short IGFET channel lengths.

In the embodiment of FIG. 14, buried layer 88 may be connected to ground potential via substrate 16 to ensure optimal switching characteristics for the device. Also, it should be understood that the breakdown voltage of the HVFET can be increased by locating one of the openings 81 close to the drain diffusion region 19.

The location, size, shape, and number of openings 81 may vary considerably in the embodiment of FIG. 14. For example, openings 81 may be hexagonal, rectilinear, circular, triangular, or some other shape. Individual ones of the openings may also vary with respect to each other. Additionally, the location, size, shape and number of openings may be arranged to create a variety of patterns (e.g., checkerboard) in buried layer 88. Those of ordinary skill in the art will further understand that the effective charges in the N-above region 72, N-below region 73, and buried layer 88 can be adjusted such that buried layer 88 depletes in a three-dimensional fashion. For instance, a spherical p-type buried layer can deplete n-type charges around it in a three-dimensional fashion. Thus, a spherically or other shaped buried layer can be formed to take advantage of multi-dimensional depletions.

Figure 7:
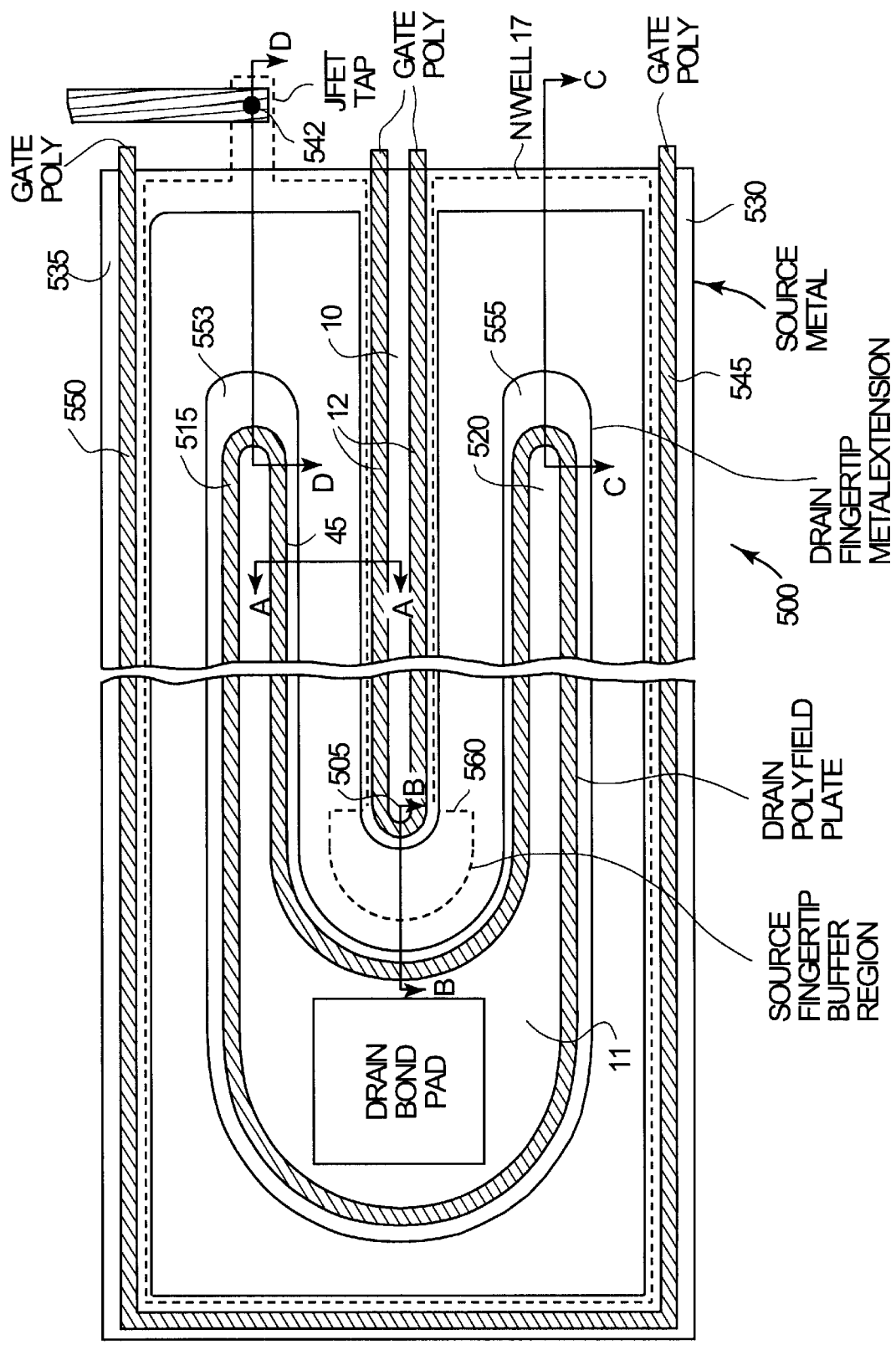
FIG. 7 is a top view of a HVFET having inter-digitated source and drain "fingertip" regions in accordance with one embodiment of the present invention.

With reference now to FIG. 7, a top view of a HVFET 500 having inter-digitated source and drain "fingertip" regions is illustrated. Various cross-sectional side views of the device structure are shown in FIGS. 3, 8, 9 and 10. (Note that FIG. 3 is a view taken along cut line A:A of FIG. 7. FIGS. 1, 2, 4, 5, and 6 also show other possible cross-sectional views taken through line A:A.) FIG. 7 shows HVFET 500 having a source fingertip 505 that includes a source electrode 10. Disposed on either side of source electrode 10 are drain fingertips 515 and 520 included in drain electrode 11. Further disposed on either side of source electrode 10 are additional source electrodes 530 and 535. Gate 12, which may be constructed of polysilicon or other suitable materials, is located adjacent source electrode 10. Similarly, gates 545 and 550 are adjacent additional source electrodes 530 and 535.

During operation of the HVFET 500, current flows from the source region to the drain region through the IGFET channel region and then through the plurality of parallel-arranged JFET conduction channels disposed within N-well region 17. The electric field in the inter-digitated HVFET 500 tends to be highest at the source fingertip 505 and drain fingertips 520 and 515 due to the small radius of each fingertip. To alleviate voltage breakdown in these regions, a source fingertip buffer region (or hole) 560 may be created in N-well region 17 Hi surrounding the source fingertip 505. Buffer region 560 is similar in function to area 60 shown in FIG. 3 of U.S. Pat. No. 5,258,636 which patent is herein incorporated by reference.

With continued reference to FIGS. 7–10, field plate extensions 553 and 555 counteract voltage breakdown at drain fingertips 515 and 520. Field plate extensions 553 and 555 overlay and are separated from the polysilicon drain field plate 45 by an inter-level dielectric layer 50 (see FIG. 9). Note that along the sides of drain fingertips 515 and 520, drain field plate 11 has a substantially shorter extension beyond the polysilicon drain field plate 45 towards the source electrode 10. This is illustrated in, for example, in the previously described cross-section taken along cut line A:A in FIG. 3.

Figure 8:
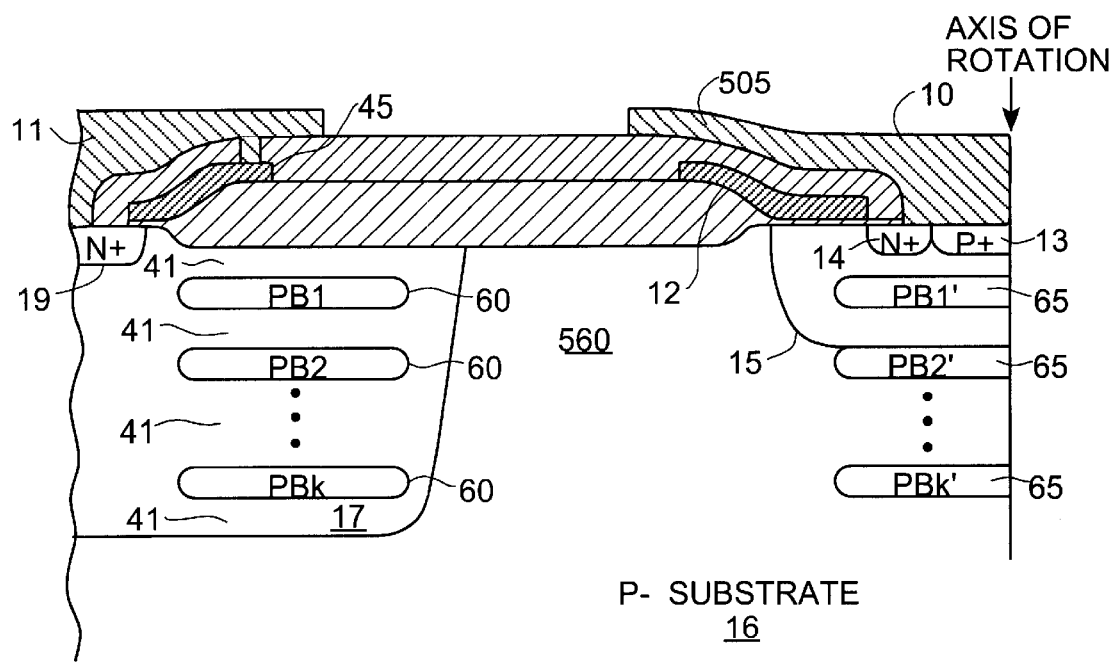
FIG. 8 is a cross-sectional side view of the HVFET shown in FIG. 7 taken along cut line B:B.
Figure 9:
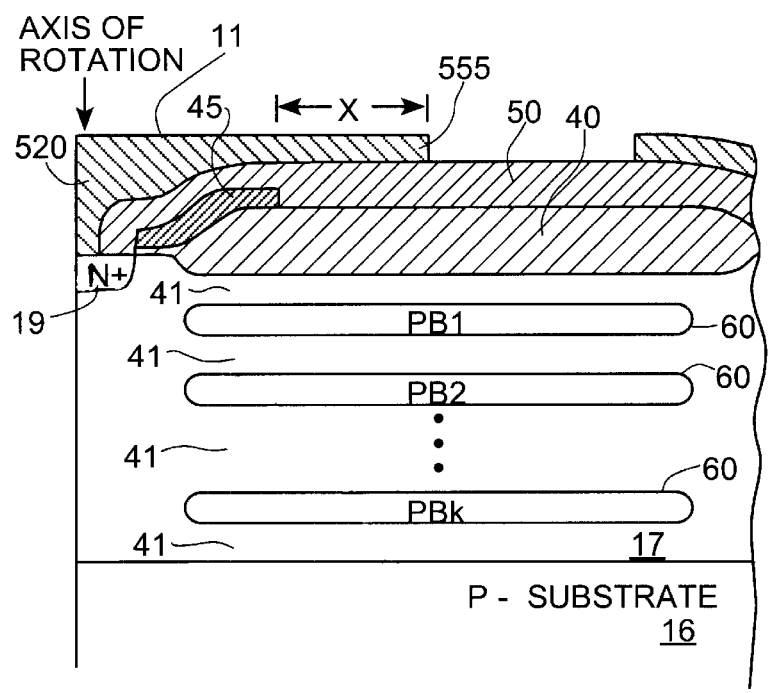
FIG. 9 is a cross-sectional side view of the HVFET shown in FIG. 7 taken along cut line C:C.

FIG. 9 is a cross-sectional side view taken along cut line C:C of FIG. 8. Here, at drain fingertip 520, drain electrode 11 includes a drain field plate extension 555 to mollify the high electric field in this area. As can be seen, the drain electrode 11 has a portion that overlies the drain field plate 45 and extends laterally over the buried regions 60. In one implementation, field plate 555 extends laterally a distance (X) of approximately 20–80 microns past the end of drain field plate 45. This is a considerably larger extension than is found along line A:A of FIG. 3, which may be, for example 10–20 microns. In this example the drain fingertip radii (defined from the axis of rotation to the farthest edge of drain diffusion region 19) may be 5 microns or less. Fabricating HVFET 500 with a small fingertip radius, of course, reduces the required silicon area for the transistor and thus lowers its cost.

Other than the buffer region 560 discussed above, the device structure at source fingertip 505 is similar to that illustrated in FIG. 3. For example, a drain diffusion region 19 is disposed underneath drain electrode 11. Similarly, source diffusion regions 13 and 14 are disposed underneath source electrode 10. A p-type region 15 may optionally surround source diffusion regions to prevent punch-through. In addition, additional P-buried regions 65 may be formed beneath the source diffusion region, as explained with respect to FIG. 3.

FIG. 9 is a cross-sectional side view taken along line C:C of FIG. 8. Here, a drain fingertip 520, drain electrode 11 includes a drain field plate extension 555 to mollify the high electric field in this area. As can be seen, the drain electrode 11 has a portion that overlies the polysilicon drain field plate 45 and extends laterally over the buried regions 60. In one implementation, field plate 555 extends laterally a distance (X) of approximately 20–50 microns past the end of drain field plate 45. This is a considerably larger extension than is found along line A:A of FIG. 3, which may be, for example 10–20 microns. In this example the drain fingertip radii may be 5 microns or less. Fabricating HVFET 500 with a small fingertip radius, of course, reduces the required silicon area for the transistor and thus lowers its cost.

Figure 10:
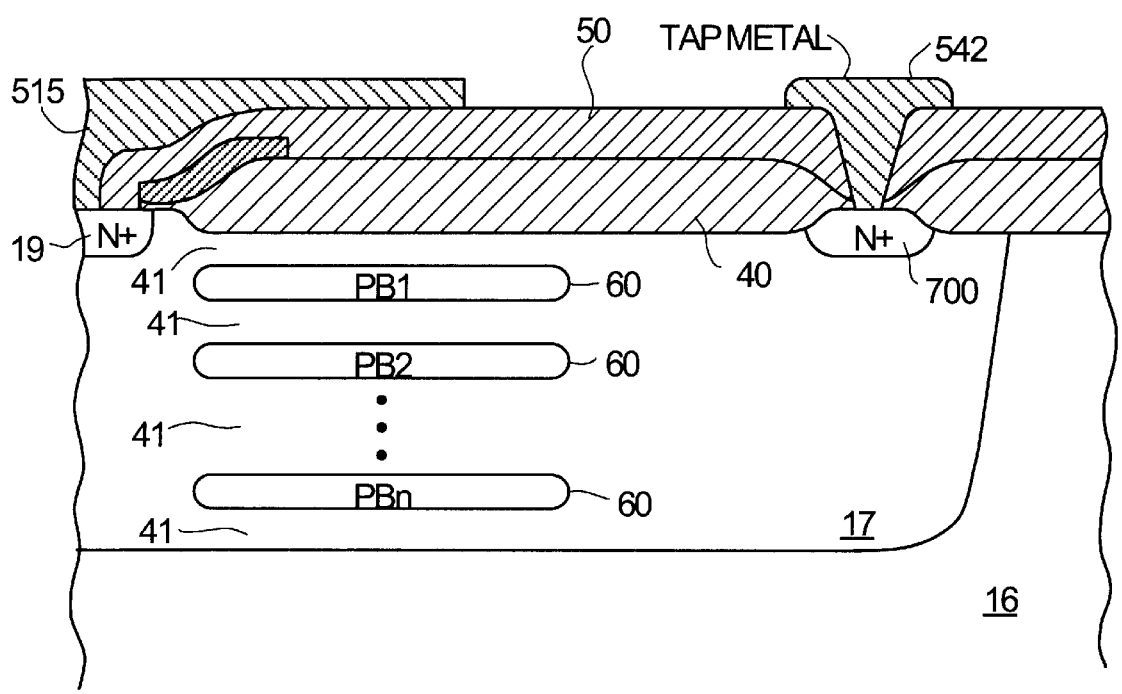
FIG. 10 is a cross-sectional side view of the HVFET shown in FIG. 7 taken along cut line D:D.

FIG. 10 is a cross-sectional view taken along cut line D:D of FIG. 7. This view shows a JFET tap 542, which provides an electrical connection to N-well 17, so that the drain voltage and/or current of the HVFET can be safely coupled to a control circuit. JFET tap 542 typically comprises a metal or metal alloy and extends down through inter-dielectric layer 50 to contact an N+ diffusion region 700. The N+ diffusion region 700 is located near a perimeter boundary of the N-well region 17. In this embodiment, JFET tap 542 is laterally separated from the active IGFET channel areas to avoid interfering with normal device operation.

When HVFET 500 is in the off state, JFET tap 542 provides a convenient power source for control circuitry and the like. Despite voltages of up to 700 volts at the drain, JFET conduction channels 41 pinch-off and keep the voltage at JFET tap 542 from exceeding approximately 10–100 volts. When HVFET 500 is in the on state, JFET tap 542 can be used to sense the drain voltage. This connection is therefore useful in applications where current limiting or similar functions are important.

Device Fabrication

Figure 11A:
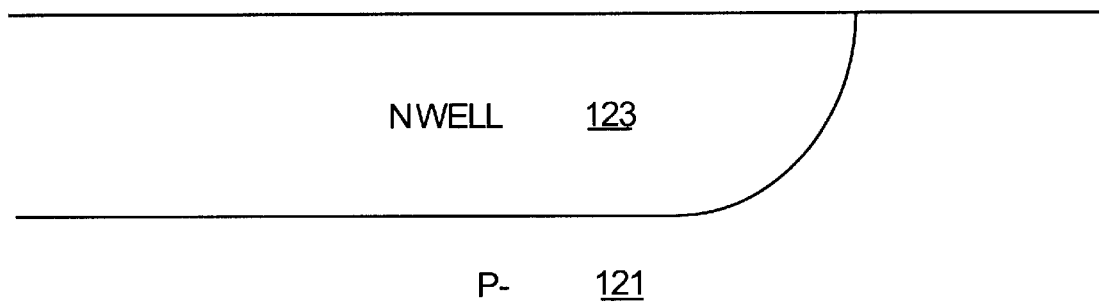
FIGS. 11a–11i are cross-sectional side views that illustrate various processing steps that may be used to fabricate a HVFET in accordance with the present invention.

The processing steps and techniques described below may be appropriately employed to fabricate the various device structures disclosed above. Starting with an ordinary p-type substrate 121, FIG. 11*a* is a cross-sectional view of the substrate following formation of the N-well region 123. N-well 123 may be defined using conventional photolithography followed by implantation of a n-type dopant such as phosphorus. A typical implant dose is in the range of $5\times10^{12}/cm^2$ to $5\times10^{13}/cm^2$ and implant energy of 150 keV. The dose is chosen to provide the proper amount of charge in each of the JFET channel regions. Therefore the dose selected for a particular implementation depends on the actual number of JFET channels to be formed. Following implantation, the dopant is driven into substrate 121 to a depth of approximately 5–15 μm.

Figure 11B:
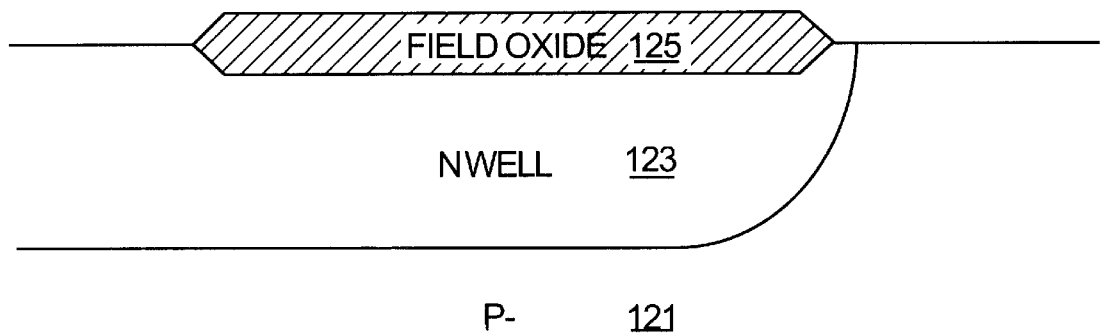

An optional step in the invented process is the formation of oxide layer 125 as shown in FIG. 11*b*. Depending on the desired device structure, the laterally extended portion of the drain may either be entirely covered by oxide (as shown), partially covered, or completely free of oxide. By way of example, a typical thickness of oxide layer 125 is about 8000 angstroms.

Next, definition of p-type buried layer 130 is achieved using ordinary photolithography steps and one or more ion implantation steps that introduce a p-type dopant such as boron into the N well region 123. The dose and energy for each of the ion implantations are chosen to provide the required amount of charge in each of the buried layers 130, and also in the corresponding JFET conduction channels.

Figure 11C:
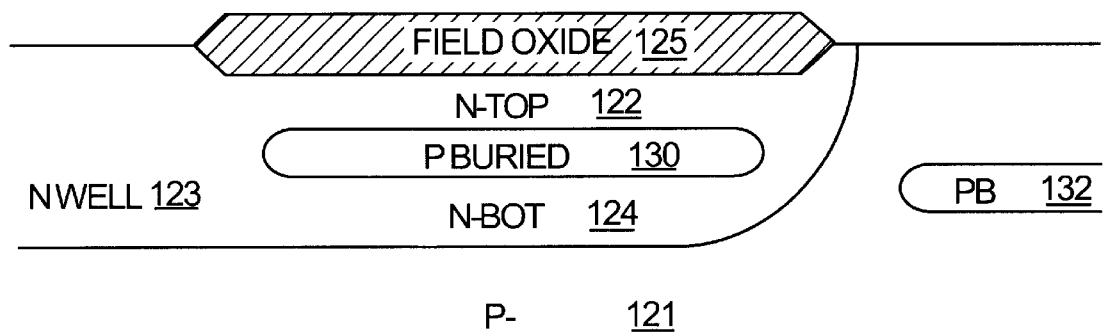

A cross-sectional view of the semiconductor substrate after formation of a single buried layer 130 is illustrated in FIG. 11*c*. The buried layer 130 may be formed using an implant dose of about $4\times10^{12}/cm^2$ with energy of about 1250 keV. At this dose and energy, a top JFET conduction channel 122 is produced above buried layer 130. A bottom JFET conduction channel 124 is produced underneath buried layer 130.

Another option is to form an additional p-type buried layer 132 within substrate 121 outside of the N-well region 123. The buried layer 132 may be formed using the same mask, and by the same ion implantation, as is used to form buried layer 130 within the N-well region 123. Thus, the formation of the additional buried layer 132 does not require an additional implantation step. Additional buried layer 132 provides device performance advantages such as reduced susceptibility to drain-to-source punch-through.

As discussed earlier, formation of oxide layer 125 over the laterally extended portion of N-well region 123 is an optional step of the process of the present invention. Several benefits of not forming oxide layer 125 include reduced processing costs and a reduction in the energy required to implant the underlying buried layers. For example, without oxide layer 125 an implant energy level of about 800 keV may be suitable to form a single buried layer 130.

For a given implantation energy, the thickness of oxide layer 125 affects the depth of buried layer 130 within N-well region 123. This means that variations in the thickness of oxide layer 125 can be utilized to purposefully vary the depth of buried layer 130. Moreover, the thickness of oxide layer 125 may be varied either continuously (sloped) or discontinuously (abrupt).

Figure 11D:
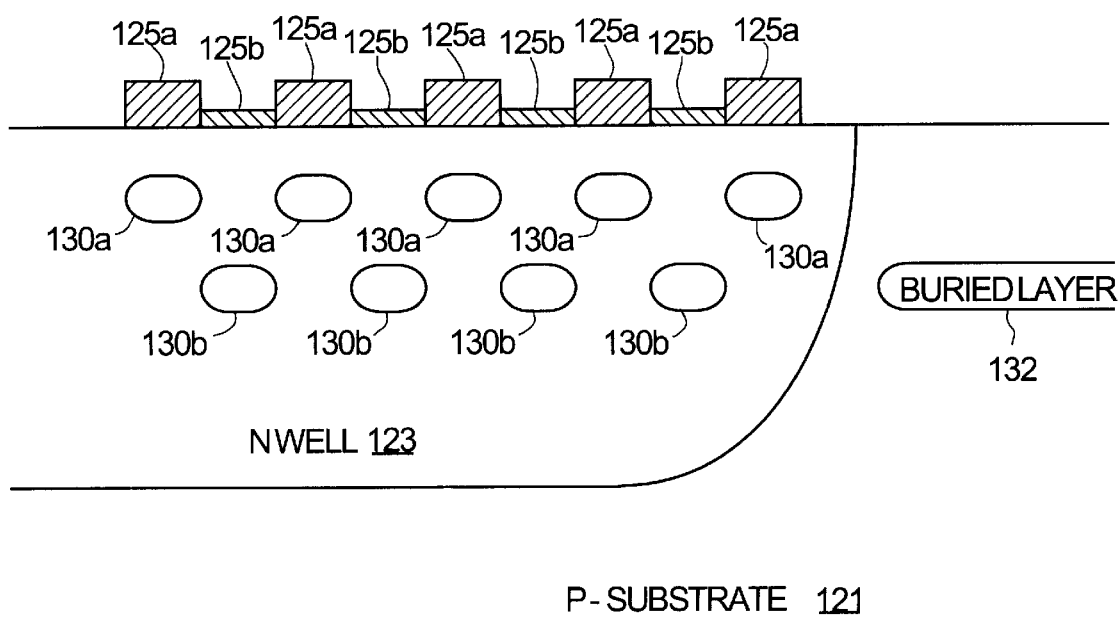

FIG. 11*d* is a cross-sectional view that illustrates how discontinuous thickness variations in oxide layer 125 may be utilized to achieve a discontinuous buried layer 130 comprising multiple buried layer sections 130*a* & 130*b* disposed at different depths within N-well region 123. Using a single implantation step through a two-tiered oxide layer (comprising sections 125*a* and 125*b*) produces buried layer sections 130*a* formed at a relatively shallow depth, and buried layer sections 130*b* formed relatively deep within N-well region 123. In the areas where the oxide layer is relatively thin (125*b*) the underlying buried layer sections 130*b* are located deep. On the other hand, in the areas where the oxide layer is relatively thick (125*a*) the underlying buried layer sections 130*a* are located relatively shallow. Thus, by employing a single P-buried implant, multiple buried layer sections can be created at differing depths within N-well region 123.

Figure 11E:
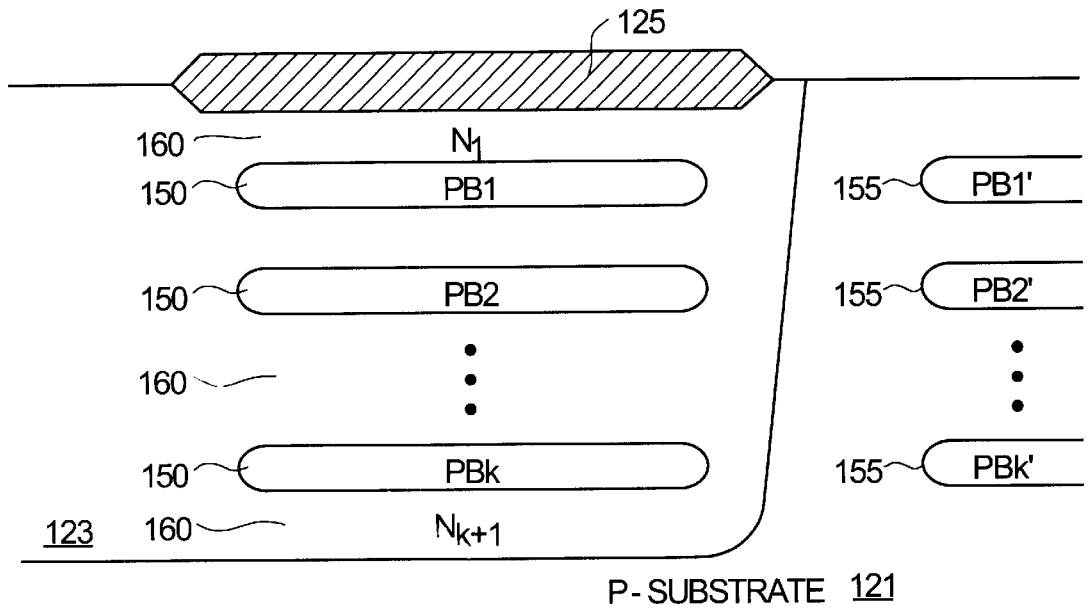

FIG. 11e illustrates a cross-sectional view of the structure of FIG. 11b following high-energy ion implantation into N-well region 123 to create multiple buried layers 150 ($PB_1$–$PB_k$). As can be seen, this produces an associated plurality of JFET conduction channels 160 ($N_1$–$N_{k+1}$) interleaved with buried layers 150. In an exemplary embodiment, the implant energies and doses are chosen such that the charge in the uppermost conduction channel 160 ($N_1$) is about $1\times10^{12}/cm^2$. This keeps the maximum electric field at the $N_1/PB_1$ junction below the critical electric field at which avalanche breakdown occurs. By the same requirement, the charge in each underlying buried layer 150 ($PB_1$–$PB_k$) and in each of the underlying JFET conduction channels 160 ($N_2$–$N_{k+1}$) is about $2\times10^{12}/cm^2$.

As shown in FIG. 3, and discussed previously, the same implant step that forms buried layers 150 may be used to simultaneously form additional buried layers 155 ($PB_1'$–$PB_k'$) in the substrate 121 beneath the source region. In other words, the same mask layer that is used to form buried layers 150 within the N-well region 123 can be used to form additional buried layers 155. Thus, the formation of the additional p-type buried layers 155 does not require additional implantation steps beyond those needed to form the p-type buried layers 150.

Figure 11F:
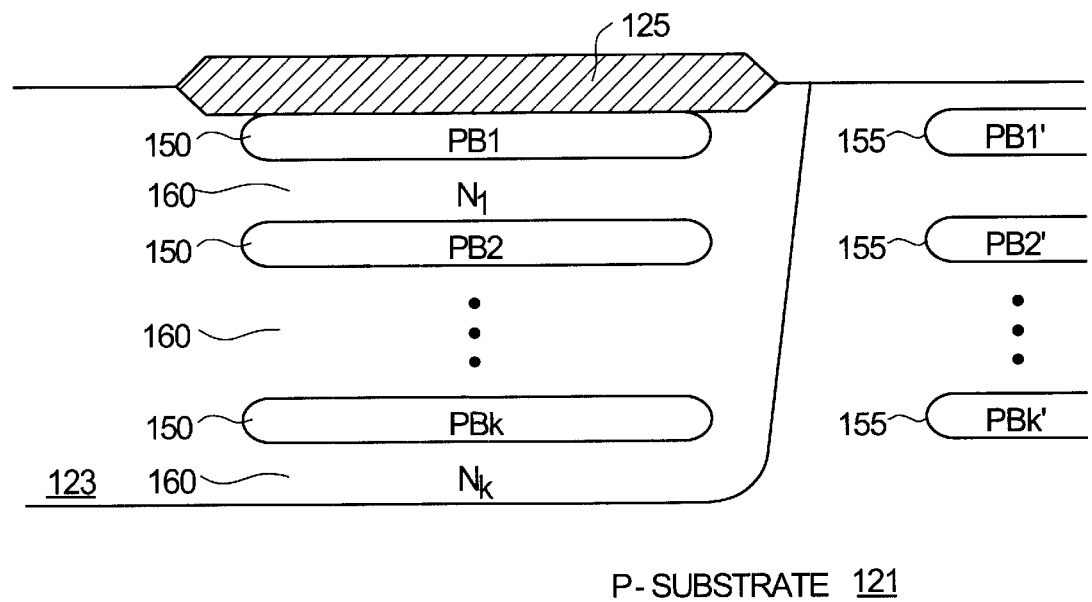

FIG. 11f illustrates a device structure similar to that of FIG. 11e, except that in FIG. 11e the uppermost buried layer 150 (PB1) is formed just under the surface of the N-well region 123. This is accomplished by appropriate reduction of the implant energies used to form each of the buried layers 150. Note that in this embodiment the number of JFET conduction channels 160 is identical to the number of buried layers 150. For example, the maximum charge in the uppermost P-buried layer 150 (PB1) is approximately $1\times10^{12}/cm^2$, while the maximum charge in each of the remaining P-buried layers 150 (and the charge in each of the JFET conduction channels 160) is approximately $2\times10^{12}/cm^2$.

The remaining processing steps are similar regardless of whether the laterally extended portion of N-well region 123 is formed with a single buried layer, multiple buried layers, or regardless of the thickness of the overlying oxide layer. Furthermore, it should be understood that the laterally extended portion of N-well region 123 may also advantageously comprise the high-voltage portion of other lateral power devices. For example, high-power diodes, JFETs, LIGBTs, and so on may also be incorporated in the laterally extended portion of N-well region 123.

Figure 11G:
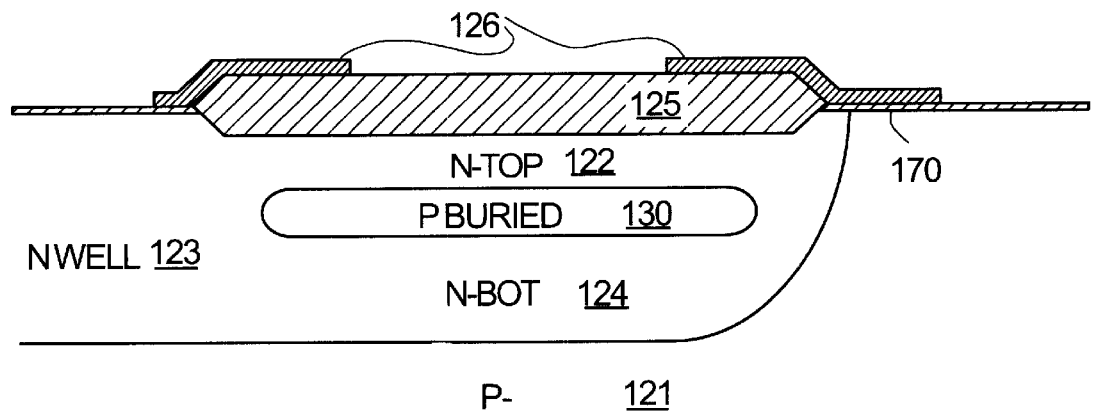

In the method of manufacturing a high-voltage IGFET, the growth or deposition of a thin gate oxide layer 170 follows the previously described high-energy implantation step (or steps). After formation of gate oxide layer 170, polysilicon field plate and gate 126 may be deposited and patterned. FIG. 11g shows a cross-sectional view of the semiconductor substrate following completion of these steps.

Figure 11H:
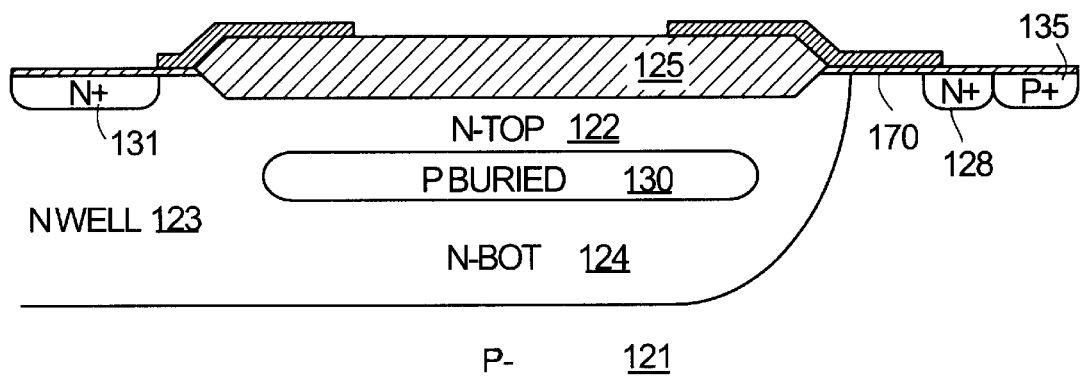

Next, the substrate surface is appropriately masked and a dopant such as arsenic or phosphorous is implanted to form N+ source diffusion region 128 and N+ drain diffusion region 131, as shown in FIG. 11h. At this point in the process, an optional P+ region 135 may be created adjacent to the source diffusion region 128 by ion implantation. Practitioners in the semiconductor fabrication arts will understand that it may be desirable to also form a P+region adjacent to drain diffusion region 131.

Figure 11I:
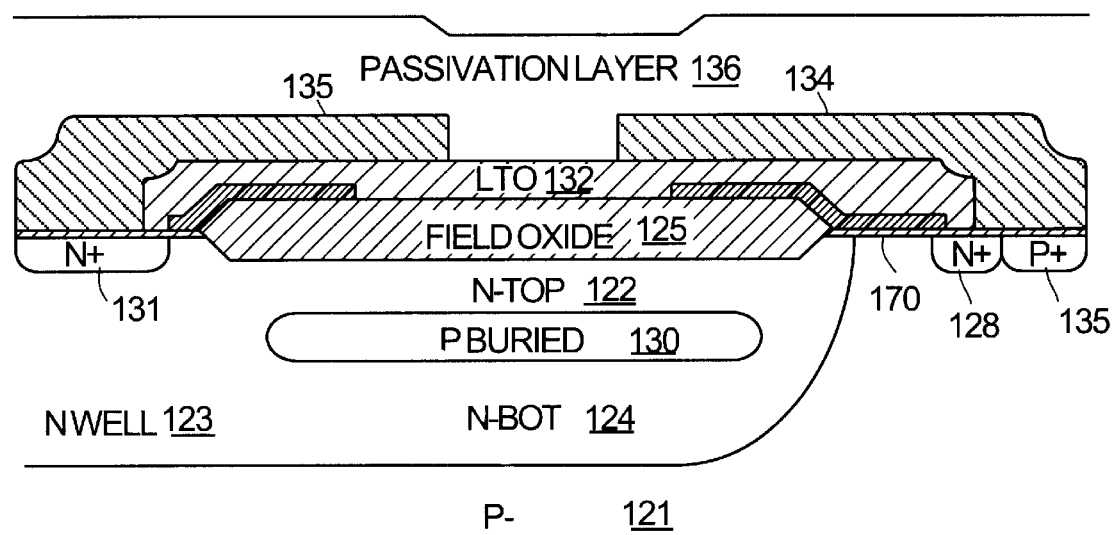

Following formation of the source and drain diffusion regions, an interlevel dielectric layer 132 may be deposited (and then densified or reflowed, if necessary) as illustrated in FIG. 11i. By way of example, dielectric layer 132 may comprise a low-temperature oxide (LTO).

Conventional photolithography and etching steps are employed to form contacts to the source and drain regions. A suitable conductive material, such as an aluminum or titanium alloy is commonly deposited and patterned to form the source and drain electrodes 134 and 135, respectively. Deposition of a passivation layer 136 and definition of pad openings complete the process. A cross-sectional view of the HVFET following the passivation step is shown in FIG. 11i.

Figure 12:
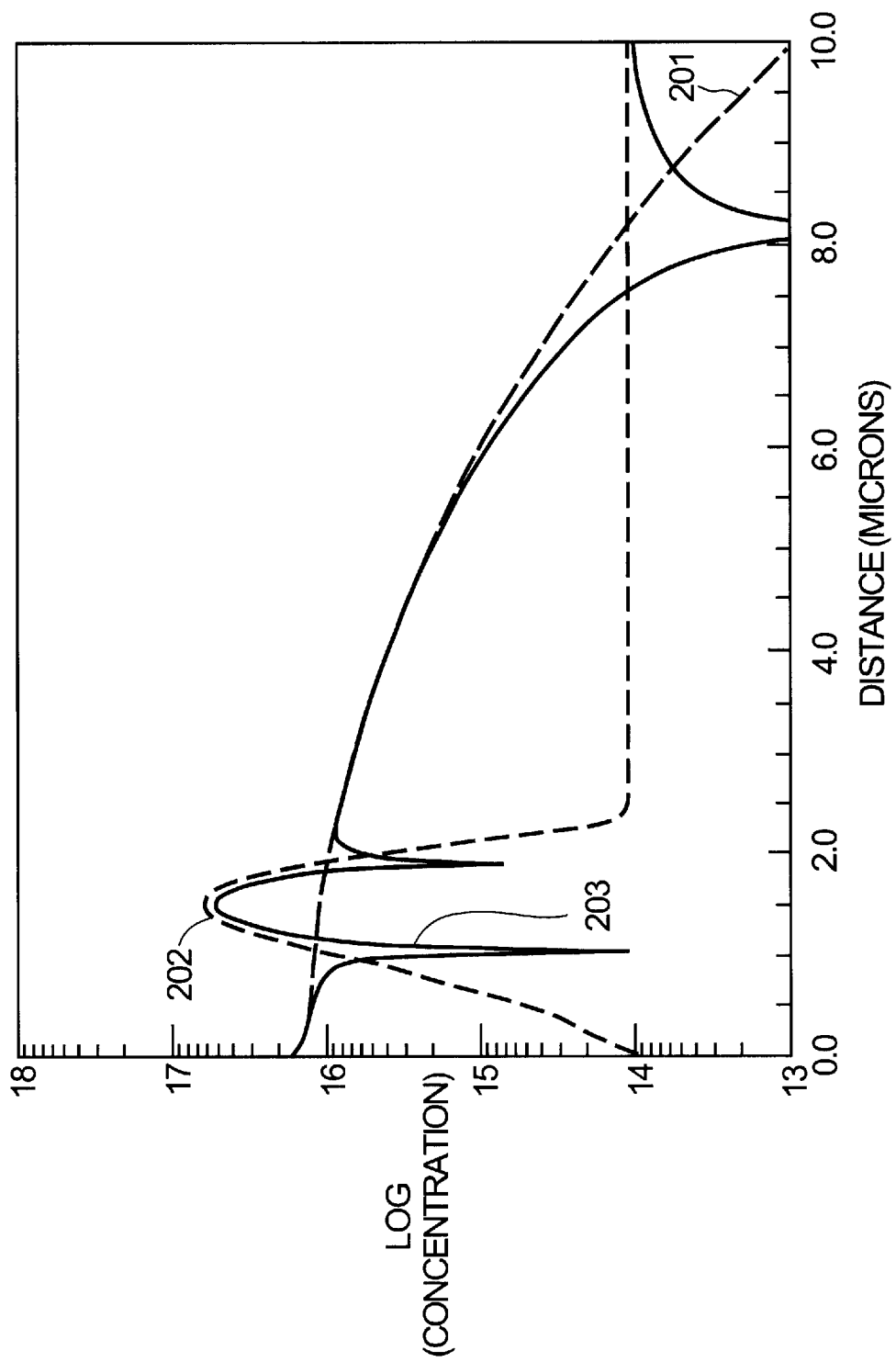
FIG. 12 is a plot of a typical impurity concentration profile within the laterally extended drain portion of the HVFET of one embodiment of the invention following the process steps illustrated in FIG. 11c.

FIG. 12 is a plot of a typical impurity concentration profile within the laterally extended drain portion of the HVFET following the process steps illustrated in FIG. 11c. FIG. 12 is for illustrative purposes only, and is not intended to limit the invention to the quantities described therein. The vertical axis of the graph represents the ion concentration represented as the logarithm of the number of ions per cubic centimeter. The horizontal axis of the graph represents the vertical distance (depth) into the semiconductor substrate 121. The depth is measured in microns from the semiconductor substrate surface.

The uncompensated impurity profile produced by the implantation and diffusion of the n-type laterally extended portion of N-well region 123 is represented by line 201. The uncompensated impurity profile produced by the high-energy implantation and diffusion of the p-type buried region 130 sandwiched within N-well region 123 is represented by line 202. Line 203 represents the net concentration of impurities after compensation has occurred. As evidenced by the similarity of line 203 to lines 201 and 202, the net effect of compensation is minimal. In other words, the method of the present invention provides for charge matching at low N-well doping levels. This advantageously results in a reduced amount of carrier scattering, as well as reduction in other undesirable side effects associated with processes involving multiple diffusions from the surface.

FIG. 12 shows the peak concentration of buried layer 130 below the surface of the laterally extended portion of the drain region 123. It should be understood that the depth of the peak concentration is determined primarily by implant energy. The plot of FIG. 12 also shows that buried region 130 is only about 1 um wide, which is primarily a function of the straggle of the high-energy implant and the time/temperature of subsequent diffusion steps.

FIG. 12 also illustrates N-top region 122 (see FIG. 11c) being formed in the region from about 0 to 0.5 µm below the surface of the substrate. The region between about 2.0 to 8.0 µm represents N-bottom region 124. The region between about 0.5 to 2.0 µm represents p-type buried region 130. According to the method of the present invention, the thickness of each region and the charge contained in each region may be selected independently by varying the energy and dose used to form N-well region 123 and buried region 130.

Figure 13:
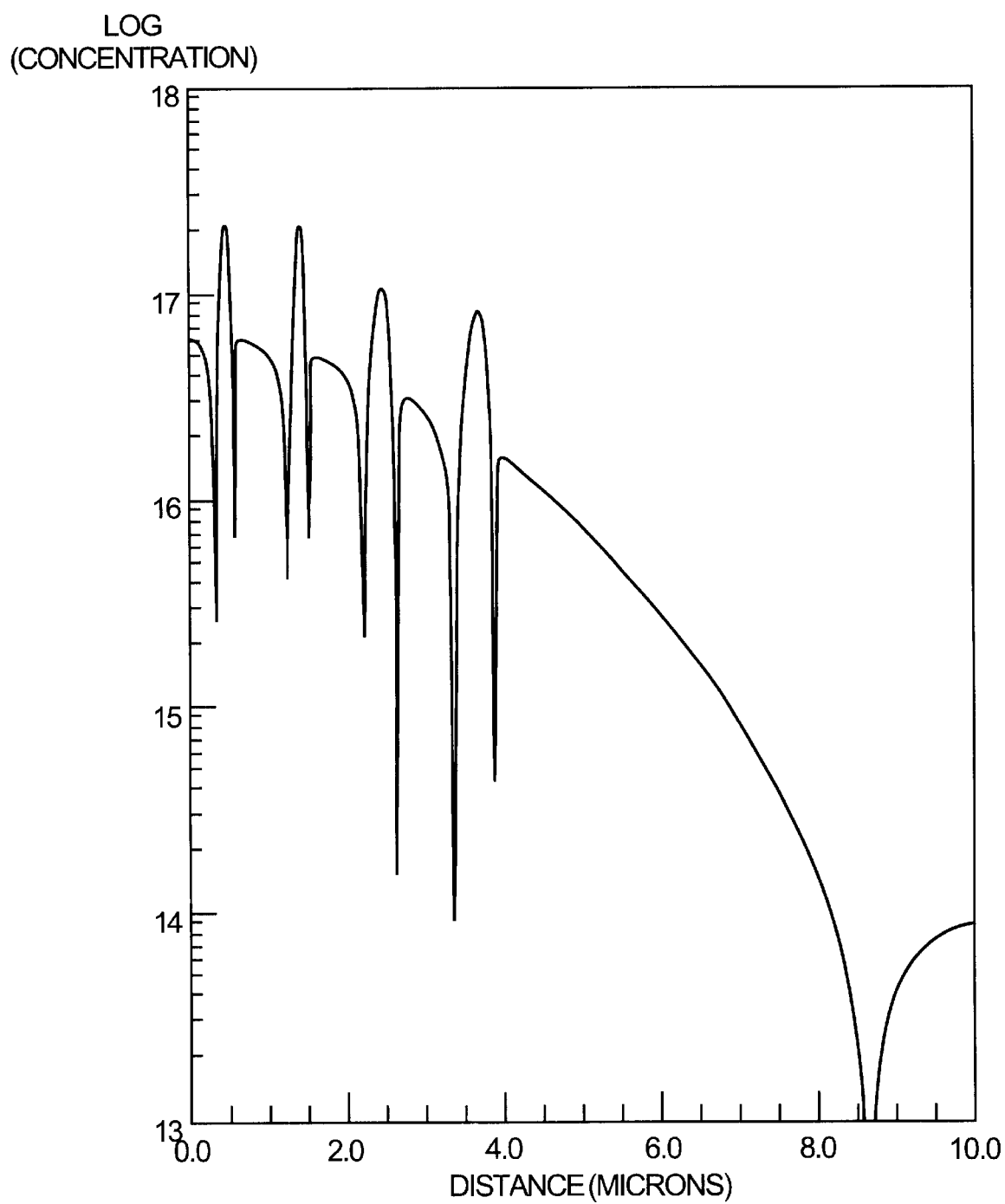
FIG. 13 is a plot illustrating net impurity concentration profile after compensation for an HVFET with five JFET channels according to one embodiment of the invention.

FIG. 13 is a plot illustrating the net impurity concentration profile after compensation for an HVFET with five JFET channels formed by four successive p-type buried implants. The vertical axis represents the ion log concentration and Levi the horizontal axis represents the vertical distance into the semiconductor substrate as measured from the surface. The dose and energy of the N-well implant and each buried layer implant are chosen to provide the appropriate doping in each layer, as previously described.

Although the processing steps in the foregoing description are for fabrication of a n-channel HVFET, it is appreciated that a p-channel HVFET can be realized by simple reversal of the conductivity types employed to form the various regions/layers.

Many other modifications are also within the scope of the invention. For example, rather than forming the N-well region by implanting and diffusing as described above, this region may be formed by epitaxial deposition, followed by high-energy implantation of the p-type dopant used to form the buried layers. In another variation, rather than implanting p-type dopant into a N-well, the n-type JFET conduction channels of the N-well region may be formed by high-energy implantation into an appropriately doped p-type diffusion or substrate region. This produces n-type doping around p-type buried regions.

Therefore, It should be understood that although the present invention has been described in conjunction with specific embodiments, numerous modifications and alterations are well within the scope of the present invention. Accordingly, the specification and drawings are to be regarded in an illustrative rather than a restrictive sense.

We claim:

1. A high voltage field-effect transistor (HVFET) comprising:
    a substrate of a first conductivity type;
    a first region of a second conductivity type;
    a source diffusion region of the second conductivity type disposed in the substrate spaced-apart from the first region to form an IGFET channel region therebetween;
    a drain diffusion region disposed in the first region;
    a first plurality of vertically spaced-apart buried layers of the first conductivity type disposed within the first region and spaced-apart from the drain diffusion region, the buried layers extending continuously across a portion of the first region to form an associated plurality of JFET channels in the first region, each of the buried layers having a length and a width the length being substantially greater than the width;
    an insulating layer disposed over the substrate; and
    a gate overlying an area of the insulating layer above the IGFET channel region.

2. The HVFET according to claim 1 further comprising:
    a second region of the first conductivity type disposed in the substrate adjacent the source diffusion region.

3. The HVFET according to claim 1 further comprising:
    a source electrode connected to the source diffusion region; and a drain electrode connected to the drain diffusion region.

4. The HVFET according to claim 3 wherein the source electrode includes a first field plate member that extends over the gate.

5. The HVFET according to claim 4 wherein the drain electrode includes a second field plate member.

6. The HVFET according to claim 1 wherein the first region comprises an epitaxial layer disposed on the substrate.

7. The HVFET according to claim 1 wherein the first region comprises a well region disposed in the substrate.

8. A high voltage field-effect transistor (HVFET) comprising:
    a substrate of a first conductivity type;
    a first region of a second conductivity type;
    a source diffusion region of the second conductivity type disposed in the substrate spaced-apart from the first region to form an IGFET channel region therebetween;
    a drain diffusion region disposed in the first region;
    a first plurality of buried layers of the first conductivity type disposed within the first region spaced-apart from the drain diffusion region, the first plurality of buried layers forming an associated plurality of JFET channels in the first region;
    a second plurality of buried layers of the first conductivity type disposed beneath the source diffusion region;
    an insulating layer disposed over the substrate; and
    a gate overlying an area of the insulating layer above the IGFET channel region.

9. The HVFET according to claim 8 wherein the second plurality of buried layers extend under the IGFET channel region.

10. A high voltage field-effect transistor (HVFET) comprising:
    a substrate of a first conductivity type;
    a first region of a second conductivity type disposed within the substrate;
    a source diffusion region of the second conductivity type disposed in the substrate spaced-apart from the first region, a channel region being formed in the substrate between the source diffusion region and the first region:
    a source electrode connected to the source diffusion region;
    a drain diffusion region of the second conductivity type disposed within the first region;
    a drain electrode connected to the drain diffusion region;
    a plurality of vertically spaced-apart buried regions of the first conductivity type disposed within the first region, all but one of the buried regions not being in contact with a too surface of the substrate, the buried regions each being spaced-apart from the drain diffusion region and extending continuously across a portion of the first region to form a corresponding plurality of conduction channels, each of the buried regions having a length and a width, the length being substantially greater than the width; and
    an insulated gate formed over the channel region.

11. The HVFET according to claim 10 further comprising:
    a second region of the first conductivity type disposed within the substrate, the source diffusion region being disposed within the second region.

12. The HVFET according to claim 11 further comprising
    a third region of the first conductivity type disposed in the second region adjacent to the source diffusion region.

13. The HVFET according to claim 10 wherein the buried regions are connected to the substrate.

14. The HVFET according to claim 10 further comprising:
    the at least one second buried region of the first conductivity type disposed within substrate beneath the source diffusion region.

15. The HVFET according to claim 14 wherein the at least one second buried region extends laterally from the source diffusion region under the channel region.

16. The HVFET according to claim 10 wherein the first and second conductivity types are p-type and n-type, respectively.

17. The HVFET according to claim 10 wherein the source and drain electrodes include field plate members.

18. A high voltage field-effect transistor (HVFET) comprising:
    a substrate of a first conductivity type;
    a first region of a second conductivity type;

a source region of the second conductivity type separated from the first region;

a drain region disposed in the first region;

a plurality of buried layers of the first conductivity type disposed within the first region and vertically separated from each other, the plurality of buried layers extending continuously across a portion of the first region to form an associated plurality of conduction channels in the first region, each of the buried layers having a length and a width, the length being substantially greater than the width; and an insulated gate extending from the source region to the first region.

19. A high voltage field-effect transistor (HVFET) comprising:

a substrate of a first conductivity type;

a first region of a second conductivity type;

a source region of the second conductivity type separated from the first region;

a drain region disposed in the first region;

a plurality of buried layers of the first conductivity type disposed within the first region and vertically separated from each other, each of the buried layers extending continuously across a portion of the first region, each of the buried layers having a length and a width, the length being substantially greater than the width; and an insulated extending from the source region to the first region.

* * * * *